US012495711B2

(12) United States Patent
Jo

(10) Patent No.: US 12,495,711 B2
(45) Date of Patent: Dec. 9, 2025

(54) TRANSPARENT DISPLAY APPARATUS HAVING A FIRST BLOCK PORTION INCLUDING A DUMMY PATTERN

(71) Applicant: LG Display Co., Ltd., Seoul (KR)

(72) Inventor: SungHak Jo, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 446 days.

(21) Appl. No.: 17/985,770

(22) Filed: Nov. 11, 2022

(65) Prior Publication Data

US 2023/0200194 A1 Jun. 22, 2023

(30) Foreign Application Priority Data

Dec. 21, 2021 (KR) .......................... 10-2021-0183828

(51) Int. Cl.
*H10K 59/12* (2023.01)
*H10D 86/40* (2025.01)
(Continued)

(52) U.S. Cl.
CPC ........... *H10K 59/88* (2023.02); *H10D 86/441* (2025.01); *H10D 86/60* (2025.01);
(Continued)

(58) Field of Classification Search
CPC .. H10K 59/88; H10K 59/131; H10K 59/1213; H10K 59/38; H10K 59/1216; H10D 86/441; H10D 86/60
(Continued)

(56) References Cited

U.S. PATENT DOCUMENTS

2017/0110521 A1 4/2017 Park et al.
2020/0273926 A1* 8/2020 Lee ...................... H10K 50/822
(Continued)

FOREIGN PATENT DOCUMENTS

CN 110192282 A * 8/2019 .......... H01L 27/3246
CN 110890408 A * 3/2020 .......... H01L 27/3265
(Continued)

OTHER PUBLICATIONS

Cite the n=machine translation Yoon H (KR-20180036333-A).*
Cite the machine translation Wang D (CN-110890408-A).*
Cite the machine translation You J (CN-110192282-A).*

*Primary Examiner* — Phuc T Dang
(74) *Attorney, Agent, or Firm* — Seed Intellectual Property Law Group LLP

(57) ABSTRACT

A transparent display apparatus is provided, which improves reflection visibility between a display area and a non-display area. The transparent display apparatus comprises a substrate provided with a display area, in which a plurality of pixels having a first transmissive portion and a plurality of subpixels are disposed, and a non-display area near the display area, and a plurality of GIP portions provided in the non-display area on the substrate, including a second transmissive portion and a plurality of block portions, respectively, wherein the plurality of subpixels include a first subpixel provided to emit white light, the plurality of block portions include a first block portion disposed at a position corresponding to the first subpixel, and the first block portion include a dummy pattern provided to be the same as or similar to the first subpixel.

20 Claims, 9 Drawing Sheets

(51) Int. Cl.
*H10D 86/60* (2025.01)
*H10K 59/121* (2023.01)
*H10K 59/131* (2023.01)
*H10K 59/38* (2023.01)
*H10K 59/88* (2023.01)

(52) U.S. Cl.
CPC ..... *H10K 59/1213* (2023.02); *H10K 59/1216* (2023.02); *H10K 59/131* (2023.02); *H10K 59/38* (2023.02)

(58) Field of Classification Search
USPC .......................................................... 257/79
See application file for complete search history.

(56) References Cited

U.S. PATENT DOCUMENTS

2021/0183986 A1 6/2021 Shin et al.
2021/0202628 A1 7/2021 Kim et al.

FOREIGN PATENT DOCUMENTS

| CN | 113053955 A | | 6/2021 |
|----|-------------|---|--------|
| KR | 20180036333 A | * | 4/2018 |
| KR | 20210085135 A | | 7/2021 |

* cited by examiner

TRANSPARENT DISPLAY APPARATUS HAVING A FIRST BLOCK PORTION INCLUDING A DUMMY PATTERN

CROSS-REFERENCE TO RELATED APPLICATIONS

This application claims the benefit of the Korean Patent Application No. 10-2021-0183828 filed on Dec. 21, 2021, which is hereby incorporated by reference as if fully set forth herein.

BACKGROUND

Technical Field

The present disclosure relates to a transparent display apparatus.

Description of the Related Art

With the advancement of the information age, the demand for a display apparatus for displaying an image has increased in various forms. Therefore, various types of display apparatuses such as a liquid crystal display (LCD) apparatus, a plasma display panel (PDP) apparatus, an organic light emitting display (OLED) apparatus and a quantum dot light emitting display (QLED) apparatus have been recently used.

Recently, studies for a transparent display apparatus in which a user may view objects or images positioned at an opposite side through the display apparatus are actively ongoing.

The transparent display apparatus includes a display area on which an image is displayed and a non-display area that includes a bezel area, wherein the display area may include a transmissive area capable of transmitting external light and a non-transmissive area such as a pixel.

BRIEF SUMMARY

In many display configurations, a plurality of signal lines for driving a pixel of a display area and a plurality of circuits are disposed in the non-display area, whereas a plurality of pixels are disposed in the display rea to display an image. The inventors have recognized that since the display area and the non-display area are different from each other in their structures, a problem occurs in that a difference in reflection visibility with respect to external light occurs.

The present provides a transparent display apparatus that improves reflection visibility between a display area and a non-display area.

In addition to the technical benefits of the present disclosure as mentioned above, additional technical benefits and features of the present disclosure will be clearly understood by those skilled in the art from the following description of the present disclosure.

In accordance with an aspect of the present disclosure, the above and other technical benefits can be accomplished by the provision of a transparent display apparatus comprising a substrate provided with a display area, in which a plurality of pixels having a first transmissive portion and a plurality of subpixels are disposed, and a non-display area near the display area, and a plurality of GIP portions provided in the non-display area on the substrate, including a second transmissive portion and a plurality of block portions, respectively, wherein the plurality of subpixels include a first subpixel provided to emit white light, the plurality of block portions include a first block portion disposed at a position corresponding to the first subpixel, and the first block portion includes a dummy pattern provided to be the same as or similar to the first subpixel.

In accordance with another aspect of the present disclosure, the above and other technical benefits can be accomplished by the provision of a transparent display apparatus comprising a substrate provided with a display area, in which a plurality of pixels having a first transmissive portion and a plurality of subpixels are disposed, and a non-display area near the display area, and a plurality of GIP portions provided in the non-display area on the substrate, including a second transmissive portion and a plurality of block portions, respectively, wherein the plurality of subpixels include a first subpixel in which at least three pixel metal layers are provided to overlap one another, the plurality of block portions include a first block portion disposed at a position corresponding to the first subpixel, and the first block portion includes at least three non-pixel metal layers disposed on the same layer as the at least three pixel metal layers and provided to overlap one another.

BRIEF DESCRIPTION OF THE SEVERAL VIEWS OF THE DRAWINGS

The above and other technical benefits, features and other advantages of the present disclosure will be more clearly understood from the following detailed description taken in conjunction with the accompanying drawings, in which.

DETAILED DESCRIPTION

Figure 1:
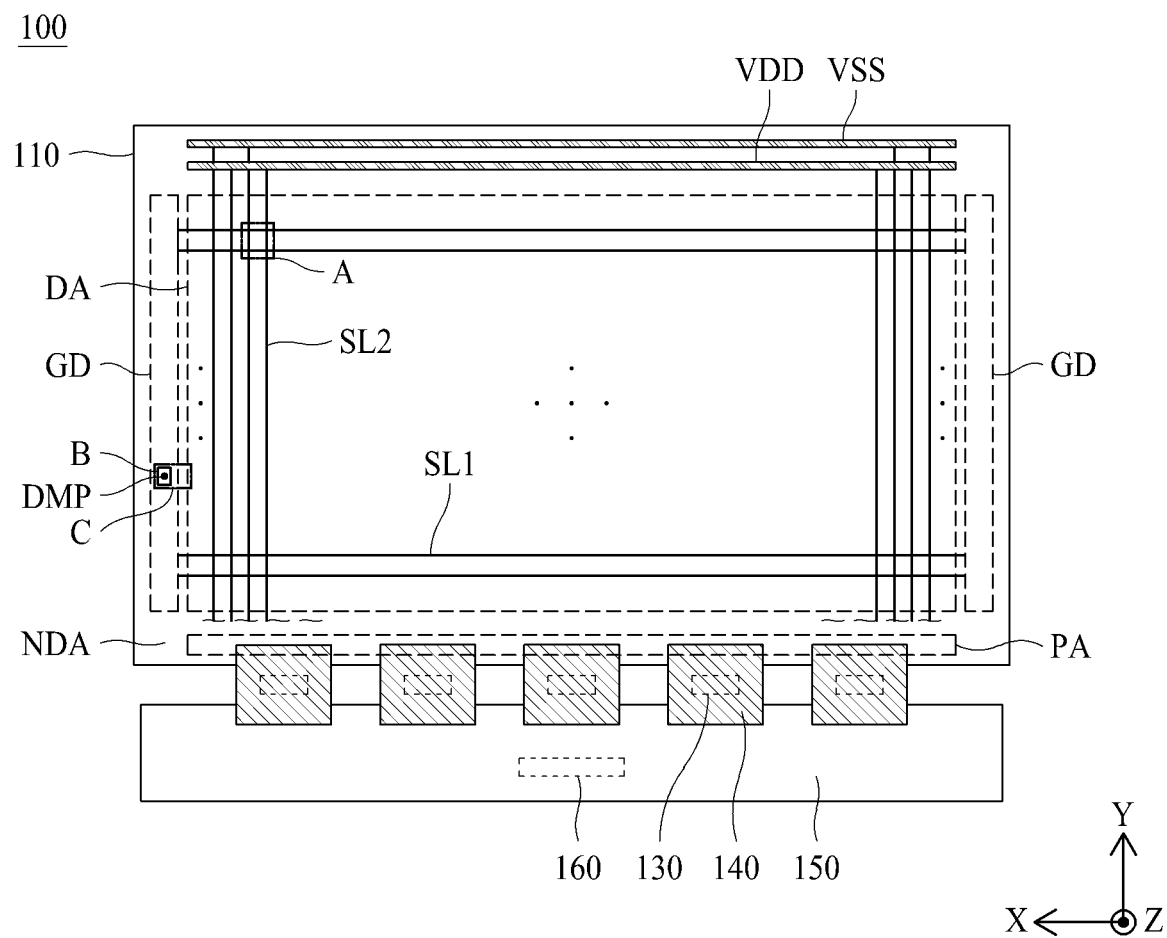
FIG. 1 is a plan view illustrating a transparent display apparatus according to one embodiment of the present disclosure.

Reference will now be made in detail to the embodiments of the present disclosure, examples of which are illustrated in the accompanying drawings. Wherever possible, the same reference numbers will be used throughout the drawings to refer to the same or like parts. Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted.

In a case where 'comprise,' 'have,' and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when a position relation between two parts is described as 'on~,' 'over~,' 'under~,' and 'next~,' one or more other parts may be disposed between the two parts unless 'just' or 'direct' is used.

In describing a temporal relationship, for example, when the temporal order is described as "after," "subsequent," "next," and "before," a case which is not continuous may be included, unless "just" or "direct" is used.

It will be understood that, although the terms "first," "second," etc., may be used herein to describe various elements, these elements should not be limited by these terms. These terms are only used to distinguish one element from another. For example, a first element could be termed a second element, and, similarly, a second element could be termed a first element, without departing from the scope of the present disclosure.

"X-axis direction," "Y-axis direction" and "Z-axis direction" should not be construed by a geometric relation only of a mutual vertical relation and may have broader directionality within the range that elements of the present disclosure may act functionally.

The term "at least one" should be understood as including any and all combinations of one or more of the associated listed items. For example, the meaning of "at least one of a first item, a second item and a third item" denotes the combination of all items proposed from two or more of the first item, the second item and the third item as well as the first item, the second item or the third item.

The term "metal" used herein should be understood as including conductive metal compounds, e.g., TiN, other conductive compounds, or other electrically conductive material.

Features of various embodiments of the present disclosure may be partially or overall coupled to or combined with each other and may be variously inter-operated with each other and driven technically as those skilled in the art can sufficiently understand. The embodiments of the present disclosure may be carried out independently from each other or may be carried out together in co-dependent relationship.

Hereinafter, example embodiments of the present disclosure will be described in detail with reference to the accompanying drawings.

Figure 2:
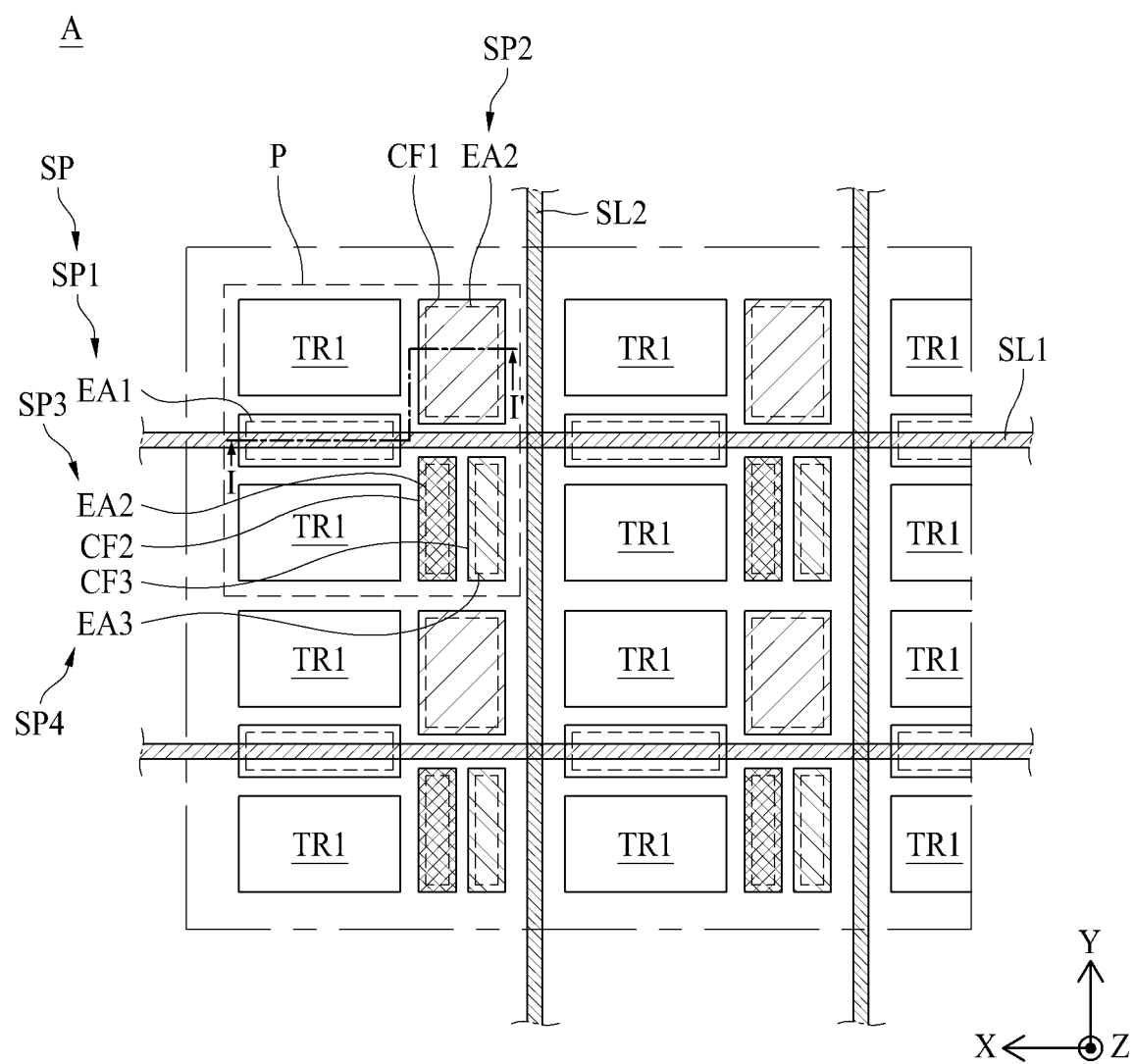
FIG. 2 is a schematic enlarged view illustrating a portion A of FIG. 1.
Figure 3:
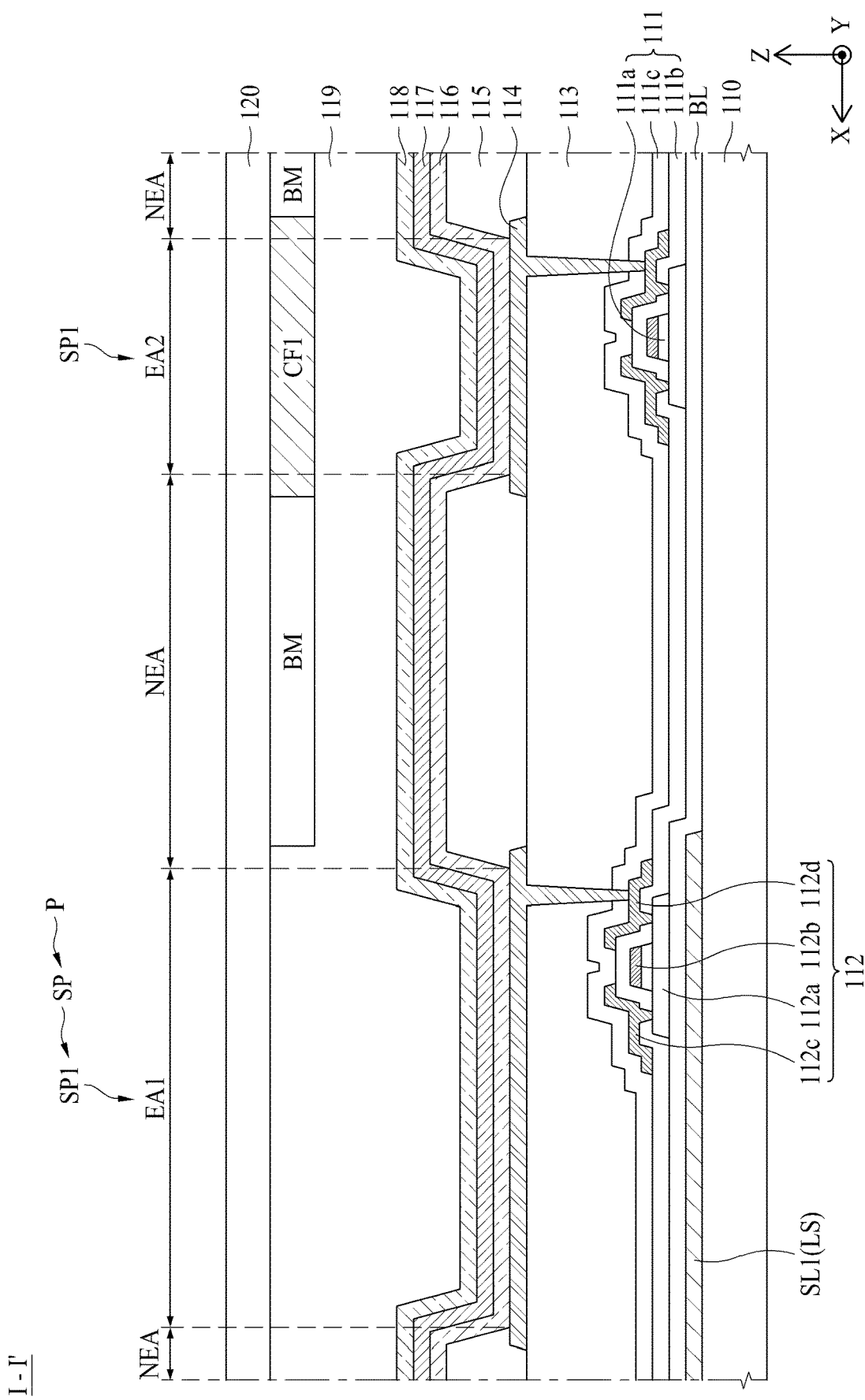
FIG. 3 is a schematic cross-sectional view taken along line I-I' shown in FIG. 2.
Figure 4:
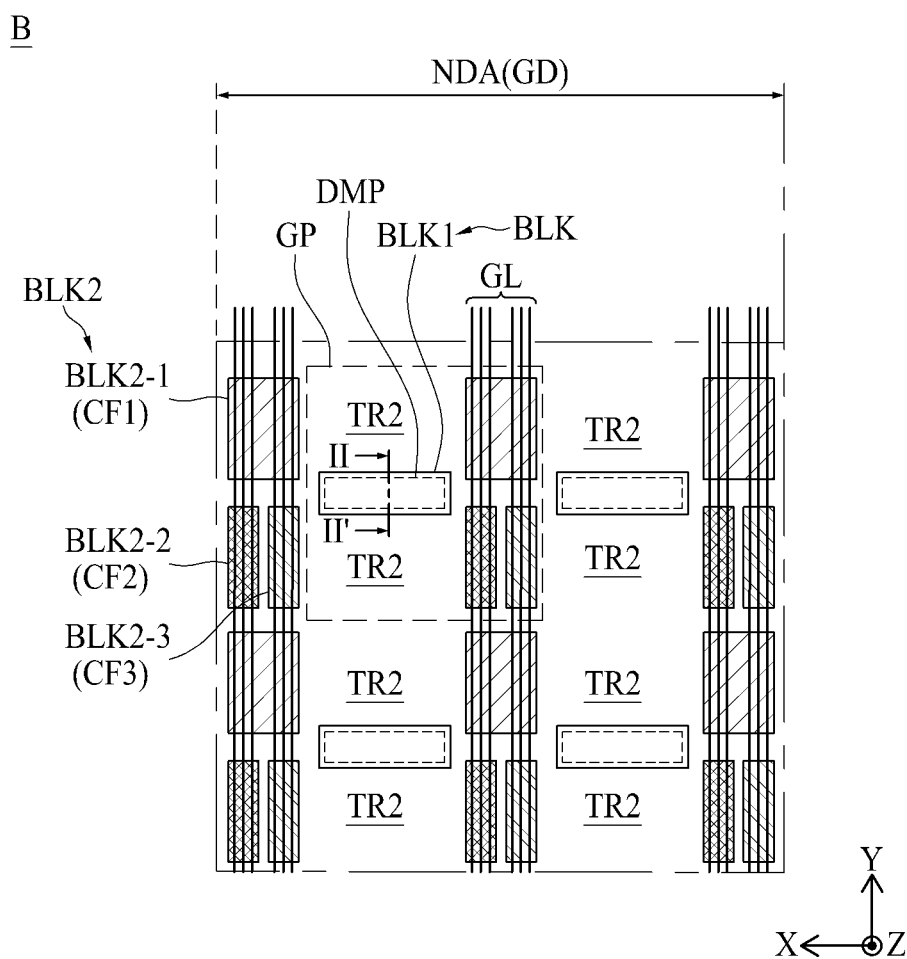
FIG. 4 is a schematic enlarged view illustrating a portion B of FIG. 1.
Figure 5:
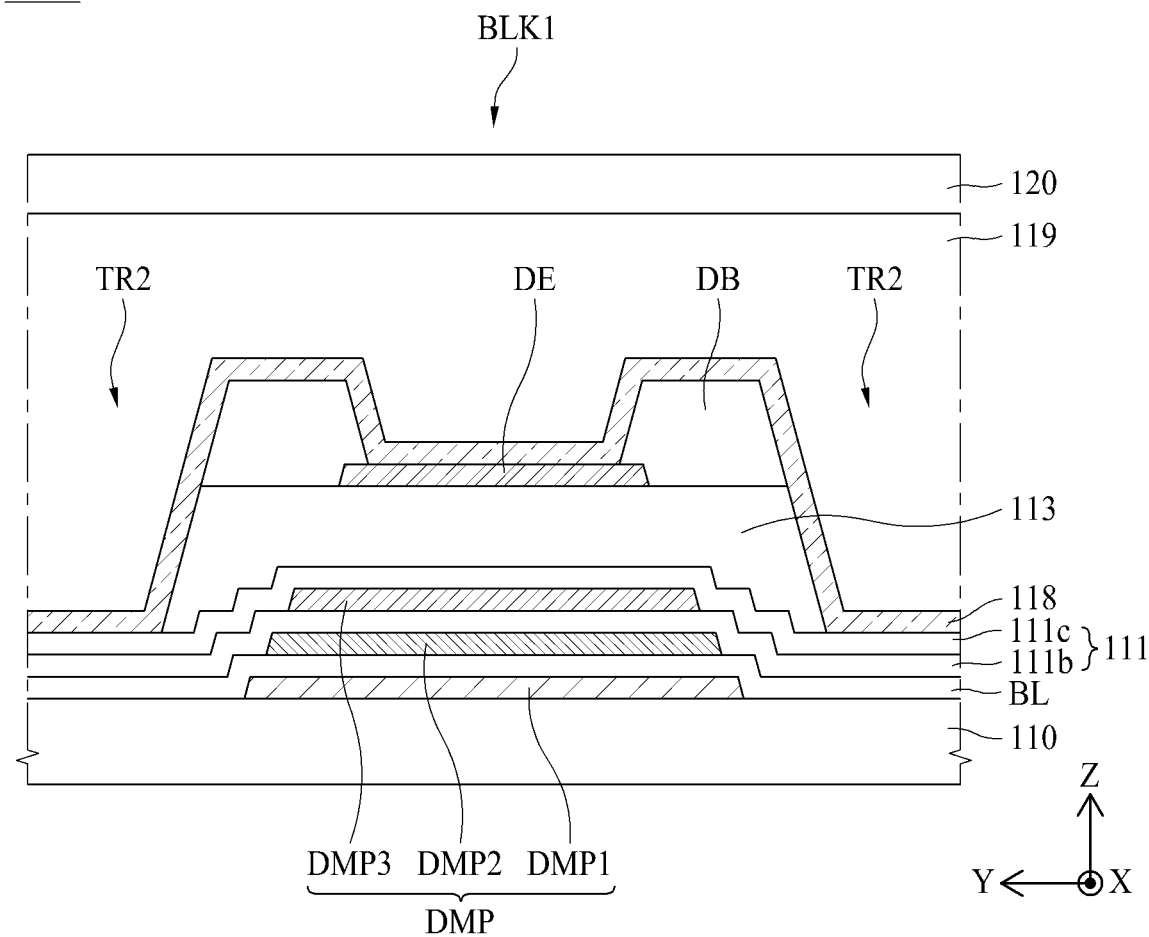
FIG. 5 is a schematic cross-sectional view taken along line II-II' shown in FIG. 4.

FIG. 1 is a plan view illustrating a transparent display apparatus according to one embodiment of the present disclosure, FIG. 2 is a schematic enlarged view illustrating a portion A of FIG. 1, FIG. 3 is a schematic cross-sectional view taken along line I-I' shown in FIG. 2, FIG. 4 is a schematic enlarged view illustrating a portion B of FIG. 1, and FIG. 5 is a schematic cross-sectional view taken along line II-IF shown in FIG. 4.

Hereinafter, the following description will be based on that a transparent display apparatus 100 according to one embodiment of the present disclosure is an organic light emitting display apparatus, but is not limited thereto. That is, the transparent display apparatus according to one embodiment of the present disclosure may be implemented as any one of a liquid crystal display apparatus, a field emission display apparatus, a quantum dot lighting emitting diode apparatus, and an electrophoretic display apparatus as well as the organic light emitting display apparatus.

Referring to FIGS. 1 to 5, a transparent display apparatus 100 according to one embodiment of the present disclosure may include a display panel having a gate driver GD that includes a dummy pattern DMP, a source drive integrated circuit (hereinafter, referred to as "IC") 130, a flexible film 140, a circuit board 150, and a timing controller 160.

The display panel may include a substrate 110 and an opposite substrate 120 (shown in FIG. 3), which are bonded to each other.

The substrate 110 may include a thin film transistor, and may be a transistor array substrate, a lower substrate, a base substrate, or a first substrate. The substrate 110 may be a transparent glass substrate or a transparent plastic substrate. For example, the substrate 110 may be a transparent glass substrate. Hereinafter, the substrate 110 will be defined as a first substrate.

The opposite substrate 120 may be bonded to the first substrate 110 via a transparent connection member (not shown). For example, the opposite substrate 120 may have a size smaller than that of the first substrate 110, and may be bonded to the remaining portion except the pad area of the first substrate 110. The transparent connection member may be an adhesive member (or transparent adhesive). The opposite substrate 120 may be an upper substrate, a second substrate, or an encapsulation substrate. The opposite substrate 120 may be bonded to a first surface of the first substrate 110 by a substrate bonding process using an adhesive member. Hereinafter, the opposite substrate 120 will be referred to as a second substrate.

The first substrate 110 according to an example may include a display area DA and a non-display area NDA.

The display area DA is an area where an image is displayed, and may be a pixel array area, an active area, a pixel array unit, a display unit, or a screen. For example, the display area DA may be disposed at a central portion of the display panel.

The display area DA according to an example may include gate lines, data lines, pixel driving power lines, and a plurality of pixels P. Each of the plurality of pixels P may include a plurality of subpixels SP that correspond to the gate lines and the data lines, and a first transmissive portion TR1 disposed to be adjacent to some or all of the plurality of subpixels SP. The first transmissive portion TR1 is an area provided to allow light to transmit front and rear surfaces of the display panel. Therefore, a user located in the direction of the front surface of the display panel may view an image or background positioned in the direction of the rear surface of the display panel through the first transmissive portion TR1.

In some embodiments, each of the plurality of subpixels SP may be a minimum unit area in which light is actually emitted.

According to an example, at least four subpixels disposed to be adjacent to one another among the plurality of subpixels SP, and one first transmissive portion TR1 constitute one unit pixel P. One unit pixel may include, but is not limited to, a red subpixel, a green subpixel, a blue subpixel, a white subpixel, and a first transmissive portion TR1. As an example, one unit pixel may include at least one red subpixel, at least one green subpixel, at least one blue subpixel, at least one white subpixel, and at least one first transmissive portion TR1.

According to another example, three subpixels disposed to be adjacent to one another among the plurality of subpixels SP, and one first transmissive portion TR1 constitute one unit pixel. One unit pixel may include, but is not limited to, at least one red subpixel, at least one green subpixel, at least one blue subpixel, and at least one first transmissive portion TR1.

Each of the plurality of subpixels SP includes a thin film transistor and a light emitting portion connected to the thin film transistor. The light emitting portion may include a light emitting element layer (or organic light emitting layer) interposed between a first electrode and a second electrode.

The light emitting element layers respectively disposed in the plurality of subpixels SP may individually emit light of their respective colors different from one another or commonly emit white light. According to an example, when the light emitting element layers of the plurality of subpixels SP commonly emit white light, each of the red subpixel, the green subpixel and the blue subpixel may include a color filter (or wavelength conversion member) for converting white light into light of its respective different color. In this case, the white subpixel according to an example may not include a color filter. In the transparent display apparatus 100 according to one embodiment of the present disclosure, a white subpixel may be a first subpixel SP1, a red subpixel may be a second subpixel SP2, a green subpixel may be a third subpixel SP3, and a blue subpixel may be a fourth subpixel SP4.

Each of the subpixels SP supplies a predetermined current to the organic light emitting element in accordance with a data voltage of the data line when a gate signal is input from the gate line by using the thin film transistor. For this reason, the light emitting portion of each of the subpixels may emit light with a predetermined brightness in accordance with the predetermined current. A structure of each of the subpixels SP will be described later with reference to FIGS. 2 and 3.

The non-display area NDA may be an area where an image is not displayed, and may be a peripheral circuit area, a signal supply area, a non-active area, or a bezel area. The non-display area NDA may be configured to be around the display area DA. That is, the non-display area NDA may be disposed to surround the display area DA.

The transparent display apparatus 100 according to one embodiment of the present disclosure may include a gate driver GD provided in the non-display area NDA.

The gate driver GD supplies gate signals to the gate lines in accordance with the gate control signal input from the timing controller 160. The gate driver GD may be formed on one side of the display area DA of the display panel or on the non-display area NDA outside both sides of the display area DA in a gate driver in panel (GIP) method as shown in FIG. 1. Alternatively, the gate driver GD may be manufactured as a driving chip, packaged in a flexible film and attached to the non-display area NDA outside one side or both sides of the display area DA of the display panel by a tape automated bonding (TAB) method. The gate driver GD according to one example may include a plurality of gate driving circuits (or GIP circuits) and a plurality of GIP lines. The GIP lines according to one example may include a plurality of signal lines and a plurality of power lines.

The plurality of gate drivers GD may be disposed at a left side of a display area DA, that is, a first non-display area and a right side of the display area DA, that is, a second non-display area. According to one example, the plurality of gate drivers GD may be connected to a plurality of pixels P and a plurality of first signal lines SL1 for respectively supplying signals to the plurality of pixels P. As shown in FIG. 1, the transparent display apparatus 100 according to one embodiment of the present disclosure may further include second signal lines SL2 crossing the plurality of first signal lines SL1.

The plurality of first signal lines SL1 may be extended in a first direction (X-axis direction). Each of the plurality of first signal lines SL1 may include at least one scan line. The first direction (X-axis direction) may refer to a direction parallel with the scan line.

Hereinafter, when the first signal line SL1 includes a plurality of lines, the first signal line SL1 may refer to a signal line group that includes a plurality of lines. For example, when the first signal line SL1 includes two scan lines, one first signal line SL1 may refer to a signal line group that includes two scan lines.

The plurality of second signal lines SL2 may be extended in a second direction (Y-axis direction). The plurality of second signal lines SL2 may cross the plurality of first signal lines SL1. Each of the second signal lines SL2 may be connected to at least one of a plurality of pads disposed in a pad area PA, a pixel power shorting bar VDD or a common power shorting bar VSS. The pixel power shorting bar VDD and the common power shorting bar VSS may be disposed in a third non-display area disposed to face the pad area PA based on the display area DA. The second direction (Y-axis direction) may be a direction parallel with a data line.

The plurality of second signal lines SL2 may include a pixel power line connected to the pixel power shorting bar VDD and a common power line connected to the common power shorting bar VSS. In one embodiment, each of the plurality of second signal lines SL2 may further include a first data line, a reference line and a second data line.

Hereinafter, when the second signal line SL2 includes a plurality of lines, one second signal line SL2 may refer to a signal line group that includes a plurality of lines. For example, when the second signal line SL2 includes two data lines, a pixel power line, a common power line and a reference line, one second signal line SL2 may refer to a signal line group that includes two data lines, a pixel power line, a common power line and a reference line.

As shown in FIG. 2, a first transmissive portion TR1 may be disposed between the first signal lines SL1 adjacent to each other. Also, the first transmissive portion TR1 may be disposed between the second signal lines SL2 adjacent to each other. That is, the first transmissive portion TR1 may be surrounded by two first signal lines SL1 and two second signal lines SL2.

The pixels P may be provided to overlap at least one of the first signal line SL1 and the second signal line SL2 to emit predetermined light, thereby displaying an image. A light emission area EA may correspond to an area, which emits light, in the pixel P.

Each of the pixels P may include at least one of a first subpixel SP1, a second subpixel SP2, a third subpixel SP3 or a fourth subpixel SP4. The first subpixel SP1 may be provided to include a first light emission area EA1 for emitting white light, the second subpixel SP2 may be provided to include a second light emission area EA2 for emitting red light, the third subpixel SP3 may be provided to include a third light emission area EA3 for emitting green light, and the fourth subpixel SP4 may be provided to include a fourth light emission area EA4 for emitting blue light, but they are not limited thereto. Each of the pixels P may include a subpixel that emits light of a color other than red, green, blue and white. In addition, various modifications may be made in the arrangement order of the subpixels SP1, SP2, SP3 and SP4.

Hereinafter, for convenience of description, the first subpixel SP1 is a white subpixel for emitting white light, the second subpixel SP2 is a red subpixel for emitting red light, the third subpixel SP3 is a green subpixel for emitting green light, and the fourth subpixel SP4 is a blue subpixel for emitting blue light.

In the transparent display apparatus 100 according to one embodiment of the present disclosure, since an organic light emitting element is provided to emit white light, the first subpixel SP1, which is a white subpixel, may not include a color filter as shown in FIGS. 2 and 3. On the other hand, the second subpixel SP2 may include a red color filter CF1 to emit red light, the third subpixel SP3 may include a green color filter CF2 to emit green light, and the fourth subpixel SP4 may include a blue color filter CF3 to emit blue light.

As shown in FIG. 2, the first subpixel SP1 may be disposed in a first direction (X-axis direction). The first subpixel SP1 may be provided to overlap the first signal line SL1. The second subpixel SP2, the third subpixel SP3 and the fourth subpixel SP4 may be adjacent to the first subpixel SP1, and may be arranged in a second direction (Y-axis direction). The second subpixel SP2 according to one example may be disposed to face the third subpixel SP3 and the fourth subpixel SP4 with the first signal line SL1 interposed therebetween. Each of the plurality of pixels P may include a first transmissive portion TR1 disposed to be adjacent to the first subpixel SP1 and the second subpixel SP2, and another first transmissive portion TR1 disposed to be adjacent to the first subpixel SP1 and the third subpixel SP3. That is, each of the plurality of pixels P may include four subpixels SP1, SP2, SP3 and SP4 and two first transmissive portions TR1, as shown in FIG. 2. The plurality of pixels P may be partitioned based on the second signal line SL2 in the first direction (X-axis direction).

The first subpixel SP1 is disposed between the first transmissive portions TR1 while being adjacent to the second to fourth subpixels SP2, SP3 and SP4, so that the first subpixel SP1 may overlap the first signal line SL1. As described above, since the first subpixel SP1 is a white subpixel provided to emit white light, the first subpixel SP1 does not include a color filter unlike the other subpixels. Therefore, when external light is reflected toward the first signal line SL1, the first subpixel SP1 may have greater reflection visibility unlike the other subpixels provided with the color filter.

In the transparent display apparatus 100 according to one embodiment of the present disclosure, the non-display area NDA may have a structure similar to that of the display area DA in order to reduce a visibility difference between the display area DA and the non-display area NDA. For example, as shown in FIG. 4, the first color filter CF1, the second color filter CF2 and the third color filter CF3 may be provided to overlap GIP signal lines GL (or a plurality of clock signal lines) provided in the second direction (Y-axis direction) in the non-display area NDA. However, a color filter is not provided at a position corresponding to the first subpixel SP1 in the non-display area NDA so as to reduce a visibility difference from the display area DA. Therefore, since there is no color filter at the position corresponding to the first subpixel SP1 in the non-display area NDA, reflection visibility due to the external light may greatly occur. When the first subpixel SP1 of the non-display area NDA has a structure different from that of the first subpixel SP1 of the display area DA, a difference in reflection visibility between the display area DA and the non-display area NDA may greatly occur. In the transparent display apparatus 100 according to one embodiment of the present disclosure, a structure of a position corresponding to the first subpixel SP1 in the non-display area NDA is the same as or similar to that of the first subpixel SP1 in the display area DA, so that the difference in reflection visibility due to the external light between the display area DA and the non-display area NDA may be reduced. In this case, the corresponding position may refer to a position in the non-display area NDA, which is parallel with the position in the display area DA, in which the first subpixel SP1 is disposed, in the first direction (X-axis direction) or the second direction (Y-axis direction).

Hereinafter, a pixel P of the transparent display apparatus 100 according to one embodiment of the present disclosure will be described with reference to FIGS. 2 and 3.

Referring to FIGS. 2 and 3, the pixel P provided in the display area DA may include a plurality of subpixels SP and a first transmissive portion TR1. As shown in FIG. 2, the first transmissive portion TR1 may be disposed to be adjacent to at least a portion of the plurality of subpixels SP. Each of the plurality of subpixels SP may include a buffer layer BL provided on a first substrate 110 to prevent moisture permeation to a thin film transistor 112.

In addition, each of the subpixels SP according to one embodiment of the present disclosure may include an inorganic layer 111 provided on an upper surface of the buffer layer BL, including a gate insulating layer 111a, an interlayer insulating layer 111b and a passivation layer 111c, a planarization layer 113 provided on the inorganic layer 111, a first electrode 114 provided on the planarization layer 113, a bank 115, an organic light emitting layer 116, a second electrode 117, a capping layer 118, and an encapsulation layer 119.

The thin film transistor 112 for driving the subpixel SP may be disposed in the inorganic layer 111. The inorganic layer 111 may be expressed as terms of a circuit element layer. The buffer layer BL may be included in the inorganic layer 111 along with the gate insulating layer 111a, the interlayer insulating layer 111b and the passivation layer 111c. The first electrode 114, the organic light emitting layer 116 and the second electrode 117 may be included in the light emitting element.

The buffer layer BL may be formed between the first substrate 110 and the gate insulating layer 111a to protect the thin film transistor 112. The buffer layer BL may be disposed on an entire surface (or front surface) of the first substrate 110. The buffer layer BL may serve to prevent or reduce a material contained in the first substrate 110 from being diffused into a transistor layer during a high temperature process of the manufacturing process of the thin film transistor. Optionally, the buffer layer BL may be omitted as the case may be.

The thin film transistor 112 according to an example may include an active layer 112a, a gate electrode 112b, a source electrode 112c, and a drain electrode 112d.

The active layer 112*a* may include a channel area, a drain area and a source area, which are formed in a thin film transistor area of a circuit area of the pixel P. The drain area and the source area may be spaced apart from each other with the channel area interposed therebetween.

The active layer 112*a* may be formed of a semiconductor material based on any one of amorphous silicon, polycrystalline silicon, oxide and organic material.

The gate insulating layer 111*a* may be formed on the channel area of the active layer 112*a*. As an example, the gate insulating layer 111*a* may be formed in an island shape only on the channel area of the active layer 112*a*, or may be formed on an entire front surface of the first substrate 110 or the buffer layer BL, which includes the active layer 112*a*.

The gate electrode 112*b* may be formed on the gate insulating layer 111*a* to overlap the channel area of the active layer 112*a*.

The interlayer insulating layer 111*b* may be formed on the gate electrode 112*b* and the drain area and the source area of the active layer 112*a*. The interlayer insulating layer 111*b* may be formed in the circuit area and an entire light emission area, in which light is emitted to the pixel P. For example, the interlayer insulating layer 111*b* may be made of an inorganic material, but is not necessarily limited thereto.

The source electrode 112*c* may be electrically connected to the source area of the active layer 112*a* through a source contact hole provided in the interlayer insulating layer 111*b* overlapped with the source area of the active layer 112*a*.

The drain electrode 112*d* may be electrically connected to the drain area of the active layer 112*a* through a drain contact hole provided in the interlayer insulating layer 111*b* overlapped with the drain area of the active layer 112*a*.

The drain electrode 112*d* and the source electrode 112*c* may be made of the same conductive material, e.g., the same metal material. For example, each of the drain electrode 112*d* and the source electrode 112*c* may be made of a single metal layer, a single layer of an alloy or a multi-layer of two or more layers, which is the same as or different from that of the gate electrode.

In addition, the circuit area may further include first and second switching thin film transistors disposed together with the thin film transistor 112, and a capacitor. Since each of the first and second switching thin film transistors is provided on the circuit area of the pixel P to have the same structure as that of the thin film transistor 112, its description will be omitted. The capacitor may be provided in an overlap area between the gate electrode 112*b* and the source electrode 112*c* of the thin film transistor 112, which overlap each other with the interlayer insulating layer 111*b* interposed therebetween.

Additionally, in order to prevent a threshold voltage of the thin film transistor provided in a pixel area from being shifted by light, the display panel or the first substrate 110 may further include a light shielding layer (not shown) provided below the active layer 112*a* of at least one of the thin film transistor 112, the first switching thin film transistor or the second switching thin film transistor. The light shielding layer may be disposed between the first substrate 110 and the active layer 112*a* to shield light incident on the active layer 112*a* through the first substrate 110, thereby reducing a change in the threshold voltage of the transistor due to external light.

The protective layer 111*c* may be provided on the first substrate 110 to cover the pixel area. The protective layer 111*c* covers the drain electrode 112*d* and the source electrode 112*c* of the thin film transistor 112 and the interlayer insulating layer 111*b*. The protective layer 111*c* may be formed in the entire circuit area and the light emission area. For example, the protective layer 111*c* may be expressed as a passivation layer. The protective layer 111*c* may be omitted.

The planarization layer 113 may be formed on the first substrate 110 to cover the protective layer 111*c*. When the protective layer 111*c* is omitted, the planarization layer 113 may be provided on the first substrate 110 to cover the circuit area. The planarization layer 113 may be formed in the entire circuit area and the light emission area. In addition, the planarization layer 113 may be formed on the other area except the pad area PA in the non-display area NDA and the entire display area DA. For example, the planarization layer 113 may include an extension portion (or enlarged portion) extended or enlarged from the display area DA to the other non-display area NDA except the pad area PA. Therefore, the planarization layer 113 may have a size relatively wider than that of the display area DA.

The planarization layer 113 according to an example may be formed to be relatively thick, and thus may provide a flat surface on the display area DA and the non-display area NDA. For example, the planarization layer 113 may be made of an organic material such as photo acryl, benzocyclobutene, polyimide, and fluorine resin.

The first electrode 114 of the subpixel SP may be formed on the planarization layer 113. The first electrode 114 is connected to the drain electrode or the source electrode of the thin film transistor 112 through a contact hole that passes through the planarization layer 113 and the protective layer 111*c*.

The first electrode 114 may be made of at least one of a transparent conductive, e.g., metal material, a semi-transmissive conductive, e.g., metal material, or a conductive, e.g., metal material having high reflectance.

When the transparent display apparatus 100 is provided in a top emission mode, the first electrode 114 may be formed of a metal material having high reflectance or a stacked structure of a metal material having high reflectance and a transparent metal material. For example, the first electrode 114 may be formed of a metal material having high reflectance, such as a stacked structure (Ti/Al/Ti) of aluminum and titanium, a stacked structure (ITO/Al/ITO) of aluminum and ITO, an Ag alloy, and a stacked structure (ITO/Ag alloy/ITO) of Ag alloy and ITO. The Ag alloy may be an alloy such as silver (Ag), palladium (Pd), and copper (Cu).

When the transparent display apparatus 100 is provided in a bottom emission mode, the first electrode 114 may be formed of a transparent conductive material (TCO) such as ITO and IZO, which may transmit light, or a semi-transmissive conductive material such as magnesium (Mg), silver (Ag) or an alloy of magnesium (Mg) and silver (Ag).

Meanwhile, the material constituting the first electrode 114 may include MoTi. The first electrode 114 may be an anode electrode or a pixel electrode.

The bank 115 is a non-light emission area in which light is not emitted, and may be provided to surround each of light emission areas (or light emitting portions) of the plurality of subpixels SP. That is, the bank 115 may partition (or surround) the respective light emission areas (or light emitting portions).

The bank 115 may be formed on the planarization layer 113 to cover an edge of the first electrode 114, thereby partitioning (or defining) the light emission areas (or light emitting portions) of the plurality of subpixels SP.

The bank 115 may be formed to cover the edge of the first electrode 114 of each of the subpixels SP and expose a portion of each of the first electrodes 114. Therefore, a current is not concentrated on an end of each of the first electrodes 114 to avoid or reduce a problem in which light emitting efficiency is degraded. An exposed portion of the first electrode 114 that is not covered by the bank 115 may be a light emission area (or light emitting portion).

The bank 115 may be formed of an organic layer such as an acrylic resin, an epoxy resin, a phenolic resin, a polyamide resin, and a polyimide resin, but is not limited thereto.

The organic light emitting layer 116 is formed on the first electrode 114 and the bank 115. When a voltage is applied to the first electrode 114 and the second electrode 117, holes and electrons move to the organic light emitting layer 116, respectively, and are combined with each other in the organic light emitting layer 116 to emit light.

The organic light emitting layer 116 may be formed in a plurality of subpixels SP and as common layer provided on the bank 115. In this case, the organic light emitting layer 116 may be provided in a tandem structure in which a plurality of light emitting layers, for example, a yellow-green light emitting layer and a blue light emitting layer are stacked, and may emit white light when an electric field is formed between the first electrode 114 and the second electrode 117.

A color filter suitable for a color of a corresponding subpixel SP may be formed on the second substrate 120. For example, a red color filter CF1 may be provided in a red subpixel, a green color filter CF2 may be provided in a green subpixel, and a blue color filter CF3 may be provided in a blue subpixel. A white subpixel may not include a color filter because the organic light emitting layer 116 emits white light.

The second electrode 117 is formed on the organic light emitting layer 116. The second electrode 117 may be a common layer commonly formed in the subpixels SP. The second electrode 117 may be made of a transparent metal material, a semi-transmissive metal material or a metal material having high reflectance.

When the transparent display apparatus 100 is provided in a top emission mode, the second electrode 117 may be formed of a transparent conductive material (TCO) such as ITO and IZO, which may transmit light, or a semi-transmissive conductive material such as magnesium (Mg), silver (Ag) or an alloy of magnesium (Mg) and silver (Ag).

When the transparent display apparatus 100 is provided in a bottom emission mode, the second electrode 117 may be formed of a metal material having high reflectance, such as a stacked structure (Ti/Al/Ti) of aluminum and titanium, a stacked structure (ITO/Al/ITO) of aluminum and ITO, an Ag alloy and a stacked structure (ITO/Ag alloy/ITO) of Ag alloy and ITO. The Ag alloy may be an alloy of silver (Ag), palladium (Pd), copper (Cu), etc. The second electrode 117 may be a cathode electrode.

The capping layer 118 may be formed on the second electrode 117 but may be omitted. When the capping layer 118 is formed, the capping layer 118 may be formed in the entire display area DA. In addition, the capping layer 118 may be disposed up to the non-display area NDA as shown in FIG. 5.

The encapsulation layer 119 is formed on the capping layer 118. The encapsulation layer 119 serves to prevent oxygen or water from being permeated into the organic light emitting layer 116 and the second electrode 117. To this end, the encapsulation layer 119 may include at least one inorganic layer.

In the transparent display apparatus 100 according to one embodiment of the present disclosure, the encapsulation layer 119 may be disposed in the non-display area NDA as well as the display area DA. The encapsulation layer 119 according to one example may be disposed between the capping layer 118 and a second substrate 120.

Since the encapsulation layer 119 is disposed in the display area DA and extended to reach the non-display area NDA, the encapsulation layer 119 may be in contact with a dam (not shown) at an outer portion of the display panel. Therefore, the transparent display apparatus 100 according to one embodiment of the present disclosure may effectively prevent moisture from being permeated into the display area DA.

Referring back to FIG. 3, a color filter and a black matrix BM may be disposed between the encapsulation layer 119 and the second substrate 120. As described above, the white subpixel, i.e., the first subpixel SP1 may not include a color filter because the organic light emitting layer 116 emits white light. On the other hand, in the second subpixel SP2, which is a red subpixel, the first color filter CF1 may be provided between the encapsulation layer 119 and the second substrate 120.

As shown in FIG. 3, a black matrix BM may be provided between the first subpixel SP1 and the second subpixel SP2 to prevent a color mixture between the first subpixel SP1 and the second subpixel SP2. The black matrix BM may be made of a black-based material, and may be disposed in a non-light emission area NEA. The black matrix BM according to one example is formed on the second substrate 120 so that at least a portion thereof overlaps the bank 115, whereby a cell gap between the organic light emitting layer 116 and the second substrate 120 may be reduced to prevent a color mixture between the subpixels from occurring.

Since the first subpixel SP1 overlaps the first signal line SL1 as shown in FIG. 2, the first signal line SL1 may be provided between the buffer layer BL and the first substrate 110 in the first subpixel SP1 as shown in FIG. 3. Therefore, the first signal line SL1 in the first subpixel SP1 may overlap a gate electrode 112b and source and drain electrodes 112c and 112d of the thin film transistor 112. That is, each of the gate electrode 112b and the source and drain electrodes 112c and 112d may overlap the first signal line SL1 below the planarization layer 113 of the first subpixel SP1. In this case, the first signal line SL1 may be the common power line VSSL connected to the common power shorting bar VSS. The first signal line SL1, the gate electrode 112b and the source and drain electrodes 112c and 112d, which are provided in the first subpixel SP1, are provided in the display area DA, and thus may be expressed as terms of a pixel metal layer.

As a result, in the transparent display apparatus 100 according to one embodiment of the present disclosure, the first subpixel SP1 provided to emit white light may be provided such that at least three pixel metal layers overlap one another. As shown in FIG. 2, since the second subpixel SP2 does not overlap the first signal line SL1, the number of pixel metal layers may be smaller than that of the first subpixel SP1. Therefore, a difference in reflection visibility between the second subpixel SP2 and the first subpixel SP1 may occur, but the second subpixel SP2 and the first subpixel SP1 are provided to emit light having their respective colors different from each other, and the first color filter CF1 is provided in the second subpixel SP2, so that a difference in reflection visibility due to the pixel metal layer may hardly occur in the second subpixel SP2 and the first subpixel SP1. Therefore, in the transparent display apparatus 100 according to one embodiment of the present disclosure, a color filter is not provided in an area (hereinafter, referred to as "first block portion BLK1") of the non-display area NDA, which corresponds to the first subpixel SP1 that is not provided with a color filter, and the same or similar lower structure is provided below the planarization layer 113 in the first subpixel and the first block portion, whereby a difference in reflection visibility between the first subpixel SP1 and the first block portion BLK1 may be reduced.

Referring to FIG. 4, in the transparent display apparatus 100 according to one embodiment of the present disclosure, the non-display area NDA may include a GIP portion GP. The GIP portion GP may have the same or similar structure as that of the pixel P of the display area DA such that a visibility difference from the display area DA is reduced. The GIP portion GP according to one example may include a first block portion BLK1, a second block portion BLK2 and a second transmissive portion TR2.

The first block portion BLK1 may refer to an area, in which the color filter is not provided, in the non-display area NDA (or the gate driver GD), and may be disposed at a position corresponding to the first subpixel SP1. The first block portion BLK1 does not include a color filter, and thus may be expressed as a white block portion. The second block portion BLK2 may be disposed to be adjacent to the first block portion BLK1 in the non-display area NDA (or the gate driver GD), and may refer to an area in which a color filter is provided. The second block portion BLK2 may include a red block portion BLK2-1, a green block portion BLK2-2 and a blue block portion BLK2-3. The red block portion BLK2-1 may include a first color filter CF1, and the first color filter CF1 may overlap at least a portion of each of the GIP signal line GL and/or the GIP circuit. The red block portion BLK2-1 may be provided at a position corresponding to the second subpixel SP2. The green block portion BLK2-2 may include a second color filter CF2 and the second color filter CF2 may overlap at least a portion of each of the GIP signal line GL and/or the GIP circuit. The green block portion BLK2-2 may be provided at a position corresponding to the third subpixel SP3. The blue block portion BLK2-3 may include a third color filter CF3, and the third color filter CF3 may overlap at least a portion of each of the GIP signal line GL and/or the GIP circuit. The blue block portion BLK2-3 may be provided at a position corresponding to the fourth subpixel SP4. The second transmissive portion TR2 of the non-display area NDA may be disposed at a position corresponding to the first transmissive portion TR1 of the display area DA. Therefore, the second transmissive portion TR2 may be disposed to be adjacent to the first block portion BLK1 and the red block portion BLK2-1 and the first block portion BLK1 and the green block portion BLK2-2, respectively.

As shown in FIG. 4, the GIP portion GP of the non-display area NDA may be provided to be the same as or similar to the pixel P of the display area DA. Therefore, in the transparent display apparatus 100 according to one embodiment of the present disclosure, the visibility difference between the display area DA and the non-display area NDA may be reduced.

Since a color filter is not provided in the first block portion BLK1 provided in the non-display area NDA, at least three metal layers may be provided to overlap one another like the first subpixel SP1. At least three metal layers provided in the first block portion BLK1 are provided in the non-display area NDA, and thus may be expressed as the terms of non-pixel metal layers.

Referring to FIG. 4, the first block portion BLK1 may be disposed between the second block portions BLK2. In more detail, the first block portion BLK1 may be disposed to be long in the first direction (X-axis direction), and may be disposed between the second block portions BLK2 adjacent to each other. In this case, the second block portions BLK2 may refer to second block portions BLK2 of two adjacent GIP portions GP. The second block portion BLK2 may be disposed to be long in the second direction (Y-axis direction) crossing the first direction (X-axis direction). Therefore, the first block portion BLK1 may be disposed in a bridge shape between the second block portions BLK2. As a result, the first block portion BLK1 and the second block portion BLK2 of the non-display area NDA may be disposed to be the same as or similar to each of the first subpixel SP1 and the second to fourth subpixels SP2, SP3 and SP4 of the display area DA, whereby the visibility difference from the display area DA may be reduced. In this case, 'the same or similar' may mean 'the same or similar' in at least one of size, shape or stacked structure.

Referring to FIG. 5, the first block portion BLK1 may include a dummy pattern DMP that is provided to be the same as or similar to the first subpixel SP1. The dummy pattern DMP according to one example may be provided by stacking a plurality of metal layers (or non-pixel metal layers). Since the first block portion BLK1 is not provided with a color filter, the dummy pattern DMP is provided to be the same as or similar to that of the pixel metal layer disposed in the first subpixel SP1, thereby reducing the difference in reflection visibility due to external light. For example, the first block portion BLK1 may be provided to have the same step difference as that of the pixel metal layer disposed in the first subpixel SP1, thereby reducing the difference in reflection visibility due to external light.

The dummy pattern DMP according to one example may include a first metal layer DMP1 disposed on the substrate 110, a second metal layer DMP2 disposed on the first metal layer DMP1 and a third metal layer DMP3 disposed on the second metal layer DMP2. In this case, the first metal layer DMP1 may be provided so that at least a portion thereof overlaps the second metal layer DMP2 and the third metal layer DMP3. Therefore, as shown in FIG. 5, the dummy pattern DMP may be disposed to have three metal layers that overlap one another, that is, the first to third metal layers DMP1, DMP2 and DMP3 below the planarization layer 113, and thus may be provided to be similar to the structure in which the first signal line SL1 or line LS in the same layer as the common voltage line, the gate electrode 112b and the source electrode 112c or the drain electrode 112d overlap one another like the first subpixel SP1 of FIG. 3.

Referring to FIGS. 3 and 5, the first metal layer DMP1 may be provided on the same layer as the common voltage line (or the first signal line SL1) provided on the substrate 110. When the common voltage line is formed in the display area DA, the first metal layer DMP1 may be formed of the same material as that of the non-display area NDA, or the gate driver GD in the non-display area NDA. Therefore, the first metal layer DMP1 disposed in the non-display area NDA may be provided on the same layer as the common voltage line of the display area DA. For example, the first metal layer DMP1 may be disposed between the first substrate 110 and the buffer layer BL.

The second metal layer DMP2 may be provided on the same layer as the gate electrode 112b of the plurality of subpixels SP, for example, the first subpixel SP1. When the gate electrode 112b is formed in the display area DA, the second metal layer DMP2 may be formed of the same material as the gate electrode 112b in the non-display area NDA or the gate driver GDin the non-display area NDA. Therefore, the second metal layer DMP2 disposed in the non-display area NDA may be provided on the same layer as the gate electrode 112b of the display area DA. For example, the second metal layer DMP2 may be disposed between the interlayer insulating layer 111b and the buffer layer BL, but is not limited thereto. The second metal layer DMP2 may be disposed between the interlayer insulating layer 111b and the gate insulating layer 111a when at least a portion of the second metal layer DMP2 may overlap the first metal layer DMP1 and the third metal layer DMP3.

The third metal layer DMP3 may be provided on the same layer as the source electrode 112c provided on the gate electrode 112b provided in the first subpixel SP1. When the source electrode 112c is formed in the display area DA, the third metal layer DMP3 may be formed of the same material as the source electrode 112c in the non-display area NDA or the gate driver GD in the non-display area NDA. Therefore, the third metal layer DMP3 disposed in the non-display area NDA may be formed on the same layer as the source electrode 112c of the display area DA. For example, the third metal layer DMP3 may be disposed between the passivation layer 111c and the interlayer insulating layer 111b. The third metal layer DMP3 disposed in the non-display area NDA may be provided on the same layer as the drain electrode 112d of the display area DA.

As a result, in the transparent display apparatus 100 according to one embodiment of the present disclosure, at least three non-pixel metal layers disposed on the same layer as at least three pixel metal layers of the first subpixel SP1 are provided to overlap one another in the first block portion BLK1, so that the difference in reflection visibility due to external light between the first subpixel SP1 and the first block portion BLK1 may be reduced. The red block portion BLK2-1, the green block portion BLK2-2 and the blue block portion BLK2-3 may be provided to be the same as or similar to the second to fourth subpixels SP2, SP3 and SP4, respectively, and in particular, include color filters having the same colors as those of the color filters of the second to fourth subpixels SP2, SP3 and SP4, respectively, so that the difference in reflection visibility due to the external light may be reduced.

Although FIG. 5 shows that, in some embodiments, the first metal layer DMP1, the second metal layer DMP2 and the third metal layer DMP3 have the same or similar width in a flat shape, the first metal layer DMP1, in some embodiments, the second metal layer DMP2 and the third metal layer DMP3 may have the same structure as that of the first signal line SL1 (or line LS disposed on the same layer as the common voltage line), the gate electrode 112b and the source electrode 112c (or the drain electrode 112d) of FIG. 3.

The first block portion BLK1 may further include a planarization layer 113, a dummy electrode DE, a dummy bank DB, a capping layer 118 and an encapsulation layer 119.

The planarization layer 113 may be disposed on the passivation layer 111c in the first block portion BLK1. The planarization layer 113 of the first block portion BLK1 may be formed of the same material as that of the planarization layer 113 of the first subpixel SP1 together with the planarization layer 113 of the first subpixel SP1, and thus may be provided to have the same thickness as that of the planarization layer 113 of the first subpixel SP1.

As shown in FIG. 4, since the second transmissive portions TR2 are disposed in the second direction (Y-axis direction) of the first block portion BLK1, both sides of the planarization layer 113 provided in the first block portion BLK1 may be disposed to be adjacent to the second transmissive portions TR2.

The dummy electrode DE may be provided on the planarization layer 113 of the first block portion BLK1. The dummy electrode DE may be provided in the same or similar structure as or to that of the first subpixel SP1 and thus formed in the non-display area NDA (or the gate driver GD) in order to reduce the visibility difference. The dummy electrode DE may be formed of the same material as that of the first electrode 114 provided in the subpixel together with the first electrode 114. The dummy electrode DE according to one example may overlap at least a portion of each of the first metal layer DMP1, the second metal layer DMP2 and the third metal layer DMP3.

In FIG. 5, since the first metal layer DMP1, the second metal layer DMP2 and the third metal layer DMP3 are provided in a flat shape, a lower surface profile of the planarization layer 113, which covers the third metal layer DMP3, may be provided to be flat. However, when the first to third metal layers DMP1, DMP2 and DMP3 are provided in the same form as the first signal line SL1 (or line LS disposed in the same layer as the common voltage line), the gate electrode 112b and the source electrode 112c of FIG. 3, the lower surface of the planarization layer 113 covering the third metal layer DMP3 may be provided as a profile of an uneven shape. In this case, the planarization layer 113 provided between the dummy electrode DE and the third metal layer DMP3 covers the uneven shape of the third metal layer DMP3, so that an upper surface of the planarization layer 113 may be provided to be flat. Since the dummy electrode DE is disposed on the planarized upper surface of the planarization layer 113, the dummy electrode DE may be also disposed to be flat. Since the dummy electrode DE provided to be flat is disposed to overlap the metal layer of an uneven shape disposed therebelow, it is possible to reduce or prevent diffused reflection of the external light by the metal layer of the uneven shape. Therefore, the dummy electrode DE provided in the first block portion BLK1 may reduce or prevent diffused reflection of external light with respect to the dummy pattern DMP.

Meanwhile, since the non-display area NDA does not emit light, a power source (or voltage) may not be supplied to the dummy electrode DE. Therefore, the dummy electrode DE may be provided in the form of floating without being electrically connected to the third metal layer DMP3. Likewise, the first metal layer DMP1, the second metal layer DMP2 and the third metal layer DMP3 are used to reduce the luminance of reflection with the display area DA. Therefore, the first metal layer DMP1, the second metal layer DMP2 and the third metal layer DMP3 may not be electrically connected to a pad portion of the pad area PA or a driving circuit of the gate driver GD. As a result, in the transparent display apparatus 100 according to one embodiment of the present disclosure, the dummy pattern DMP, that is, the first metal layer DMP1, the second metal layer DMP2 and the third metal layer DMP3 may be provided in the form of an island.

The dummy bank DB may be provided to cover an edge of the dummy electrode DE on the planarization layer 113. The dummy bank DB may be provided in the same structure as that of the bank 115 provided in the display area DA, so that the visibility difference from the display area DA may be reduced. The dummy bank DB according to one example may be formed of the same material as that of the bank 115 of the display area DA together with the bank 115.

Referring back to FIG. 5, since the non-display area NDA does not emit light, the organic light emitting layer 116 and the second electrode 117 may not be provided. Therefore, as shown in FIG. 5, the capping layer 118 may cover an upper surface of the passivation layer 111c, sides of the planarization layer 113 and an upper surface and sides of the dummy bank DB, which are exposed in the second transmissive portion TR2, and an upper surface of the dummy electrode DE, which is exposed between the dummy banks DB, but is not limited thereto. The organic light emitting layer 116 and the second electrode 117 may be provided on the dummy electrode DE in order to reduce the visibility difference from the display area DA. Even though the organic light emitting layer 116 and the second electrode 117 are provided on the dummy electrode DE, no power source (or voltage) is not supplied to the dummy electrode DE, so that the organic light emitting layer 116 may not emit light.

The encapsulation layer 119 may be provided to cover the capping layer 118 provided in the first block portion BLK1 and the capping layer 118 provided in the second transmissive portions TR2 adjacent to the first block portion BLK1. The encapsulation layer 119 provided in the non-display area NDA may include at least one inorganic layer and at least one organic layer. Therefore, the encapsulation layer 119 provided in the non-display area NDA may prevent moisture from being permeated from the outside of the substrate 110 toward the display area DA.

Meanwhile, the first block portion BLK1 may not include a color filter in order to reduce a visibility difference from the first subpixel SP1. Therefore, the second substrate 120 may be disposed on the encapsulation layer 119 of the first block portion BLK1 so that the second substrate 120 may be directly in contact with the encapsulation layer 119 of the first block portion BLK1.

As a result, in the transparent display apparatus 100 according to one embodiment of the present disclosure, the structure of the GIP portion GP of the non-display area NDA is similar to or the same as that of the pixel P of the display area DA, so that a visibility difference with respect to a user between the display area DA and the non-display area NDA may be reduced, and the difference in reflection visibility due the external light may be reduced.

In more detail, there is no color filter in the first block portion BLK1, and three non-pixel metal layers are disposed below the planarization layer 113 to overlap one another, so that the non-pixel metal layers are provided in a structure (or step difference) the same as or similar to that of the first subpixel SP1, whereby a visibility difference due to naked eyes and a difference in reflection visibility due to external light may be reduced. Since the red block portion BLK2-1 of the second block portion BLK2 includes a red color filter CF1, a visibility difference due to naked eyes and a difference in reflection visibility due to external light from the second subpixel SP2 may be reduced. Since the green block portion BLK2-2 of the second block portion BLK2 includes a green color filter CF2, a visibility difference due to naked eyes and a difference in reflection visibility due to external light from the third subpixel SP3 may be reduced. Since the blue block portion BLK2-3 of the second block portion BLK2 includes a blue color filter CF3, a visibility difference due to naked eyes and a difference in reflection visibility due to external light from the fourth subpixel SP4 may be reduced.

Figure 6:
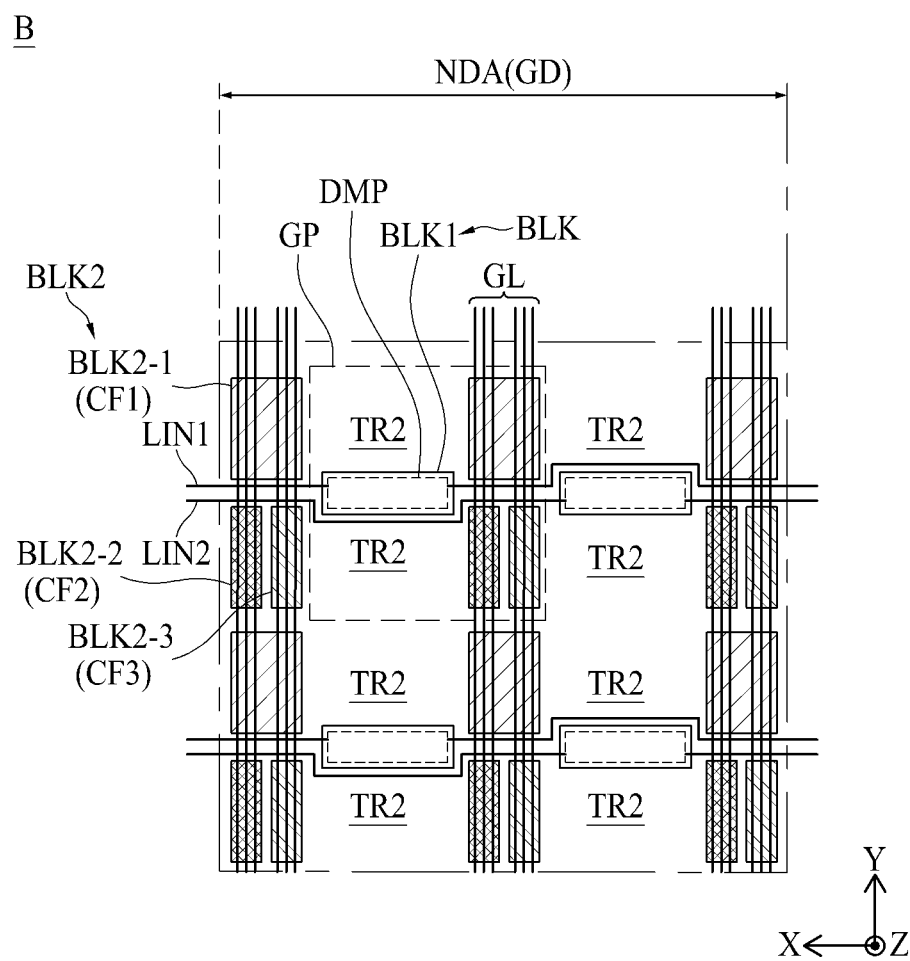
FIG. 6 is a plan view illustrating a transparent display apparatus according to another embodiment of the present disclosure.

FIG. 6 is a plan view illustrating a transparent display apparatus according to another embodiment of the present disclosure.

Referring to FIG. 6, the transparent display apparatus 100 according to another embodiment of the present disclosure is the same as the transparent display apparatus according to FIGS. 1 to 5 except that the dummy pattern DMP is used as a line for supplying a signal or power source to the display area DA. Therefore, the same reference numerals are given to the same elements, and the following description will be based on the differences.

In case of the transparent display apparatus according to FIG. 1, the first block portion BLK1 may be provided to reduce the visibility difference due to naked eyes and the difference in reflection visibility due to external light from the display area DA. Therefore, the first metal layer DMP1, the second metal layer DMP2 and the third metal layer DMP3 are not electrically connected to the pad portion of the pad area PA or the driving circuit of the gate driver GD, and may be provided in the form of an island as shown in FIG. 5.

On the other hand, in case of the transparent display apparatus according to FIG. 6, the dummy pattern DMP may be used as a signal line for supplying a signal to the display area DA or a power supply line for supplying a power source. The first metal layer DMP1, the second metal layer DMP2 and the third metal layer DMP3 of the dummy pattern DMP are made of the same metal material as that of each of the common power line VSSL, the gate electrode 112b and the source electrode 112c and are insulated from one another, and thus may be used as signal lines or power supply lines.

The dummy pattern DMP according to one example may transfer a signal for emitting a plurality of pixels P as at least one of the first metal layer DMP1, the second metal layer DMP2 or the third metal layer DMP3 is connected to the pad portion provided in the pad area PA or the gate line of the display area DA through a first line LIN1.

The dummy pattern DMP according to another example may transfer a power source (or voltage) for emitting a plurality of pixels P as at least one of the first metal layer DMP1, the second metal layer DMP2 or the third metal layer DMP3 is connected to a pixel power shorting bar VDD or a common power shorting bar VSS, which is provided in the non-display area NDA, through a second line LIN2.

As shown in FIG. 6, since a plurality of first block portions BLK1 are provided in the non-display area NDA, a plurality of dummy patterns DMP including at least three non-pixel metal layers may be disposed. Since the dummy patterns DMP disposed at different positions are used as signal lines or power supply lines, the number of additional lines may be reduced as compared with the case that the dummy pattern DMP is not electrically used, whereby a width of the non-display area NDA (or bezel) may be reduced. In addition, since the non-pixel metal layers provided in the dummy pattern DMP have widths and areas greater than those of a general signal line or power line, a problem such as signal reduction or voltage drop may be improved.

As a result, in the transparent display apparatus 100 according to another embodiment of the present disclosure, at least one of the first metal layer DMP1, the second metal layer DMP2 or the third metal layer DMP3 of the first block portion BLK1 is used as a signal line and/or a power line, so that a bezel width may be reduced and a problem such as signal reduction or voltage drop may be improved.

Figure 7:
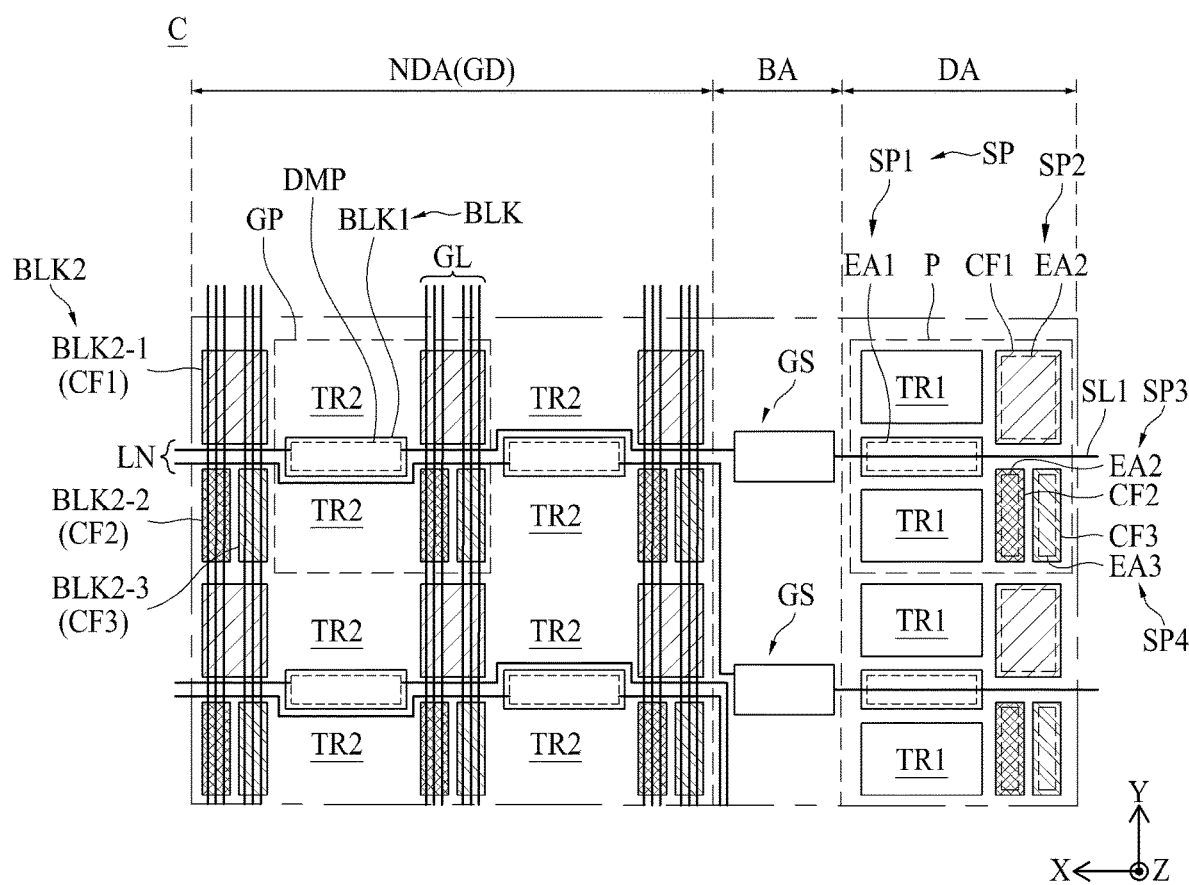
FIG. 7 is a plan view illustrating another example of a portion C of FIG. 1, which is included in a transparent display apparatus according to another embodiment of the present disclosure.

FIG. 7 is a plan view illustrating another example of a portion C of FIG. 1, which is included in a transparent display apparatus according to another embodiment of the present disclosure.

Referring to FIG. 7, the transparent display apparatus 100 according to another embodiment of the present disclosure is the same the transparent display apparatus according to FIGS. 1 to 5 except that it includes a buffer area BA disposed to be adjacent to the display area DA and the dummy pattern DMP is electrically connected to a plurality of GIP circuits GS of the buffer area BA. Therefore, the same reference numerals are given to the same elements, and the following description will be based on the differences.

In case of the transparent display apparatus according to FIG. 1, the first block portion BLK1 may be provided to reduce the visibility difference due to naked eyes and the difference in reflection visibility due to external light from the display area DA. Therefore, the first metal layer DMP1, the second metal layer DMP2 and the third metal layer DMP3 are not electrically connected to the pad portion of the pad area PA or the driving circuit of the gate driver GD, and may be provided in the form of an island as shown in FIG. 5.

On the other hand, in case of the transparent display apparatus according to FIG. 7, the dummy pattern DMP may be electrically connected to the GIP circuit GS provided in the buffer area BA. For example, the GIP circuit GS provided in the buffer area BA may be a gate signal generation circuit. Each of the plurality of dummy patterns DMP may be electrically connected to each of the plurality of GIP circuits GS provided in the buffer area BA. In this case, the dummy pattern DMP connected to each of the plurality of GIP circuits GS may be used as a capacitor. Since at least three non-pixel metal layers are provided in the dummy pattern DMP to overlap one another, the dummy pattern DMP may be used as a capacitor.

For example, the dummy pattern DMP may receive a power source through a plurality of power lines LN connected to a power supply and maintain a voltage supplied to a plurality of GIP circuits GS provided in the buffer area BA for one frame. The plurality of GIP circuits GS may be connected to the first signal line SL1 (or the gate line) to supply a gate signal. When the first metal layer DMP1 functions as a first capacitor electrode, the second metal layer DMP2 or the third metal layer DMP3 may function as a second capacitor electrode. When the second metal layer DMP2 functions as the first capacitor electrode, the first metal layer DMP1 or the third metal layer DMP3 may function as the second capacitor electrode. When the third metal layer DMP3 functions as the first capacitor electrode, the first metal layer DMP1 or the second metal layer DMP2 may function as the second capacitor electrode.

As a result, in the transparent display apparatus 100 according to another embodiment of the present disclosure, the dummy pattern DMP is provided to be used as a capacitor of the buffer area BA, so that the visibility difference due to naked eyes of a user and the difference in reflection visibility due to external light from the display area DA may be reduced. Since the voltage supplied to the plurality of GIP circuits GS may be maintained for one frame without additional capacitor, manufacturing costs may be reduced due to the omission of additional capacitor.

Figure 8:
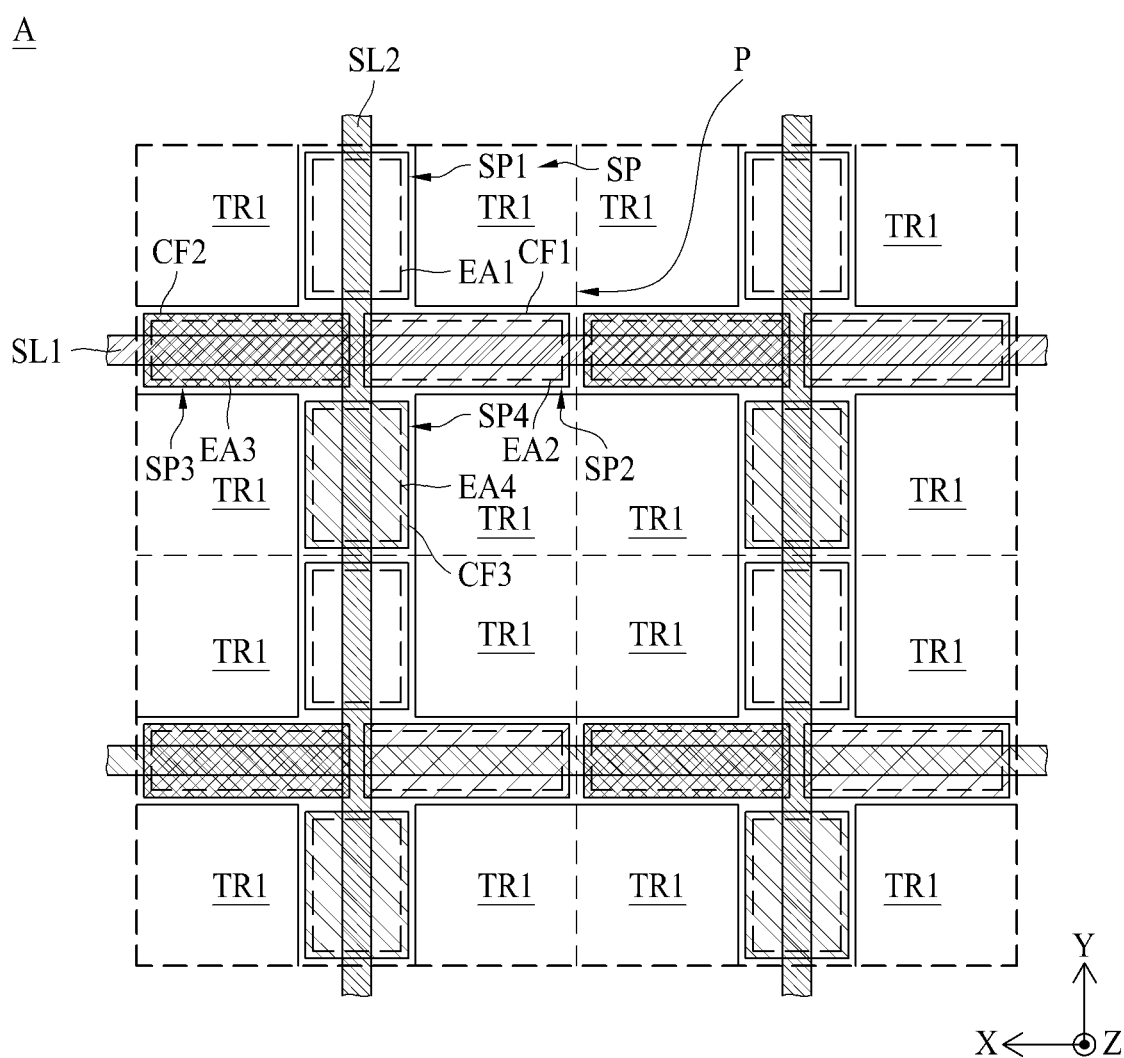
FIG. 8 is a schematic enlarged view illustrating another example of a portion A of FIG. 1, which is included in a transparent display apparatus according to another modified embodiment of the present disclosure.
Figure 9:
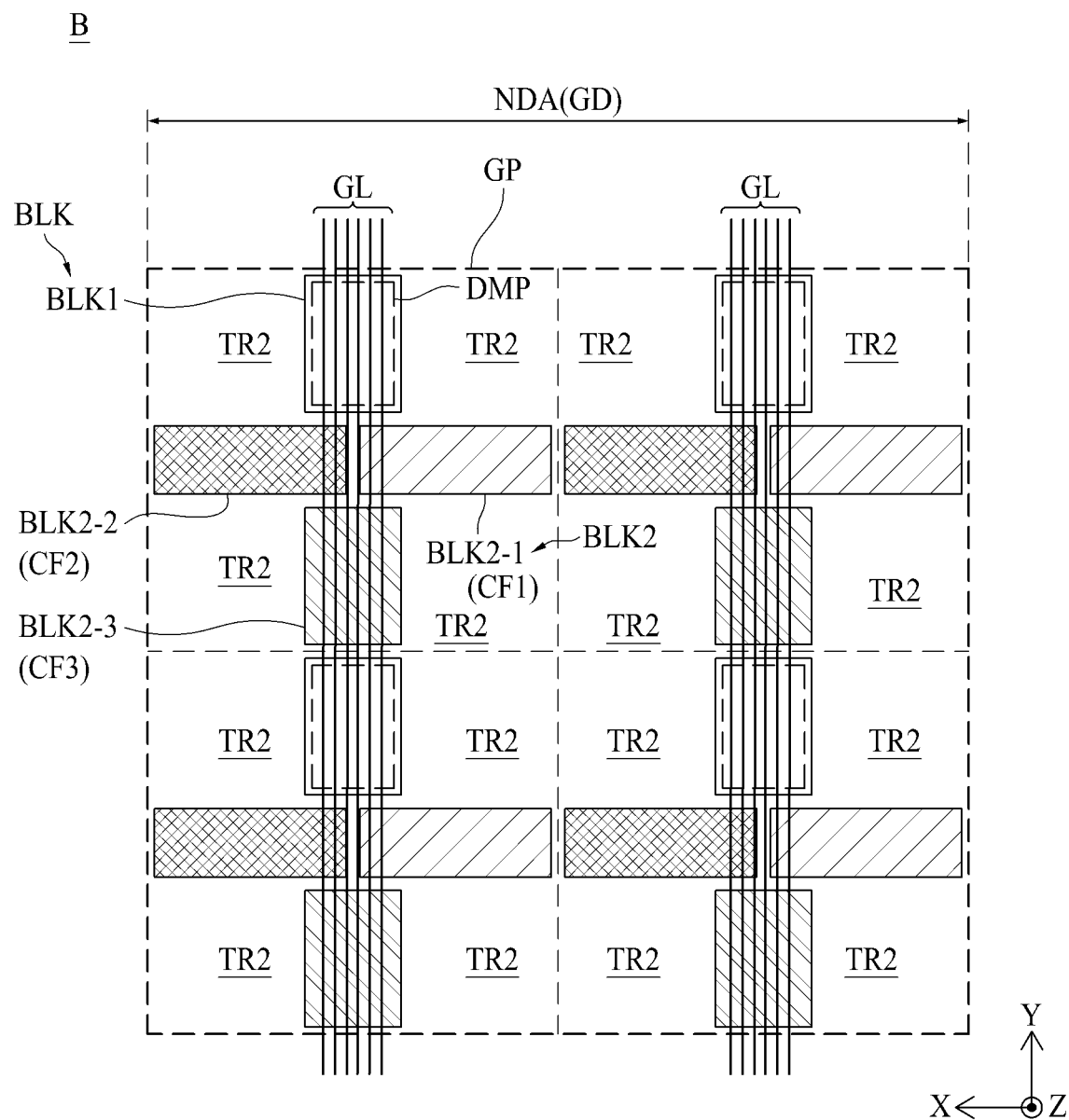
FIG. 9 is a schematic enlarged view illustrating another example of a portion B of FIG. 1, which is included in a transparent display apparatus according to other modified embodiment of the present disclosure.

FIG. 8 is a schematic enlarged view illustrating another example of a portion A of FIG. 1, which is included in a transparent display apparatus according to another modified embodiment of the present disclosure, and FIG. 9 is a schematic enlarged view illustrating another example of a portion B of FIG. 1, which is included in a transparent display apparatus according to other modified embodiment of the present disclosure.

Referring to FIGS. 8 and 9, the transparent display apparatus 100 according to another modified embodiment of the present disclosure is the same as the transparent display apparatus according to FIGS. 1 to 7 except that the structure of the pixel P of the display area DA and the structure of the GIP portion GP of the gate driver are modified. Therefore, the same reference numerals are given to the same elements, and the following description will be based on the differences.

In case of the transparent display apparatus according to FIG. 1, the subpixels SP1, SP2, SP3 and SP4 respectively included in the plurality of pixels P are disposed in a T-shape in the first direction (X-axis direction) and two first transmissive portions TR1 are disposed at both sides of the first subpixel SP1. Each of the plurality of GIP portions GP disposed in the non-display area NDA (or the gate driver GD) is provided to be the same as or similar to the plurality of pixels P.

For example, the gate driver GD may include a plurality of circuits and a plurality of lines, and a first color filter CF1, a second color filter CF2 and a third color filter CF3 may be disposed in at least a portion of each of the plurality of circuits and/or the plurality of lines to overlap one another. The area in which the first color filter CF1, which is a red color filter, is disposed in the gate driver GD may be a red block portion BLK2-1, and the red block portion BLK2-1 may be disposed at a position corresponding to the second subpixel SP2. The area in which the second color filter CF2, which is a green color filter, is disposed in the gate driver GD may be a green block portion BLK2-2, and the green block portion BLK2-2 may be disposed at a position corresponding to the third subpixel SP3. The area in which the third color filter CF3, which is a blue color filter, is disposed in the gate driver GD may be a blue block portion BLK2-3, and the blue block portion BLK2-3 may be disposed at a position corresponding to the fourth subpixel SP4. The area, in which no color filter is provided, between the plurality of circuits and/or between the plurality of lines in the gate driver GD may be the first block portion BLK1 (or white block portion), and the white block portion BLK1 may be disposed at a position corresponding to the first subpixel SP1. Two second transmissive portions TR2 may be disposed at both sides of the white block portion BLK1. As a result, the blocks BLK1, BLK2, BLK3 and BLK4 of the GIP portion GP may be disposed in a T-shape in the first direction (X-axis direction), and two second transmissive portions TR2 may be disposed at both sides of the first block portion BLK1.

Therefore, in the transparent display apparatus according to FIG. 1, the structure of the pixel P of the display area DA is provided to be the same as or similar to that the GIP portion GP of the non-display area NDA (or the gate driver GD), so that the visibility difference due to naked eyes of a user and the difference in reflection visibility due to the external light may be reduced.

In contrast, in case of the transparent display apparatus according to FIG. 8, the subpixels SP1, SP2, SP3 and SP4 respectively included in the plurality of pixels P may be disposed in a pinwheel shape or '+' shape. Each of the plurality of pixels P includes four first transmissive portions TR1, and each of the first transmissive portions TR1 may be disposed to be adjacent to two subpixels. Since the first subpixel SP1 is provided to emit white light, the color filter may not be disposed in the first subpixel SP1. Since the second subpixel SP2 is provided to emit red light, the first color filter CF1, which is a red color filter, may be disposed in the second subpixel SP2. Since the third subpixel SP3 is provided to emit green light, the second color filter CF2, which is a green color filter, may be disposed in the third subpixel SP3. Since the fourth subpixel SP4 is provided to emit blue light, the third color filter CF3, which is a blue color filter, may be disposed in the fourth subpixel SP4.

As shown in FIG. 8, when four pixels P are disposed to be adjacent to one another, one first transmissive portion TR1 of each pixel P may be disposed adjacent to another first transmissive portion TR1. That is, as shown in FIG. 8, four first transmissive portions TR1 of four pixels P may be disposed to be adjacent to one another at a portion where four pixels P are adjacent to one another. Since the four first transmissive portions TR1 are disposed to adjacent to one another, the area of the transmissive portion may be more increased than the case where the first transmissive portions TR1 are alternately or randomly disposed, whereby visibility of a background or an image behind the display panel may be more improved.

Referring to FIG. 9, each of the plurality of GIP portions GP disposed in the non-display area NDA (or the gate driver GD) may be provided to be the same as or similar to that of the plurality of pixels P shown in FIG. 8.

For example, the gate driver GD may include a plurality of circuits and a plurality of lines, and a first color filter CF1, a second color filter CF2 and a third color filter CF3 may be disposed in at least a portion of each of the plurality of circuits and/or the plurality of lines to overlap one another. The area in which the first color filter CF1, which is a red color filter, is disposed in the gate driver GD may be a red block portion BLK2-1, and the red block portion BLK2-1 may be disposed at a position corresponding to the second subpixel SP2. The area in which the second color filter CF2, which is a green color filter, is disposed in the gate driver GD may be a green block portion BLK2-2, and the green block portion BLK2-2 may be disposed at a position corresponding to the third subpixel SP3. The area in which the third color filter CF3, which is a blue color filter, is disposed in the gate driver GD may be a blue block portion BLK2-3, and the blue block portion BLK2-3 may be disposed at a position corresponding to the fourth subpixel SP4. The area, in which no color filter is provided, between the plurality of circuits and/or between the plurality of lines in the gate driver GD may be the first block portion BLK1 (or white block portion), and the white block portion BLK1 may be disposed at a position corresponding to the first subpixel SP1. One GIP portion GP may include four second transmissive portions TR2. One of the four second transmissive portions TR2 may be disposed to be adjacent to the white block portion BLK1 and the red block portion BLK2-1. Another one of the four second transmissive portions TR2 may be disposed to be adjacent to the red block portion BLK2-1 and the blue block portion BLK2-3. Still another one of the four second transmissive portions TR2 may be disposed to be adjacent to the blue block portion BLK2-3 and the green block portion BLK2-2. The remaining one of the four second transmissive portions TR2 may be disposed to be adjacent to the green block portion BLK2-2 and the white block portion BLK1. As a result, the blocks BLK1, BLK2, BLK3 and BLK4 of the GIP portion GP may be disposed in a pinwheel shape or '+' shape, and the four second transmissive portions TR2 may be disposed to be adjacent the two block portions.

Meanwhile, in the transparent display apparatus 100 according to FIG. 8, the dummy pattern DMP is provided to be the same as the dummy pattern DMP of the display apparatus according to FIG. 1 and thus its description will be omitted.

As a result, in the transparent display apparatus 100 according to another modified embodiment of the present disclosure, the pixel P of the display area DA and the GIP portion GP of the non-display area NDA (or the gate driver GD) have the same or similar structure in which four second transmissive portions TR2 and block portions having a pinwheel shape or '+' shape are provided, so that the visibility difference due to naked eyes of a user and the difference in reflection visibility due to the external light may be reduced.

According to the present disclosure, the following advantageous effects may be obtained.

In the present disclosure, the structure of the GIP portion of the non-display area is provided to be the same as or similar to the structure of the pixel of the display area, so that the difference in reflection visibility between the display area and the non-display area may be reduced.

Also, in the present disclosure, the structure of the GIP portion of the non-display area is provided to be similar to that of the pixel of the display area, the GIP portion of the non-display area may be used as a capacitor or line.

It will be apparent to those skilled in the art that the present disclosure described above is not limited by the above-described embodiments and the accompanying drawings and that various substitutions, modifications and variations can be made in the present disclosure without departing from the spirit or scope of the disclosures. Consequently, the scope of the present disclosure includes all variations or modifications derived from the meaning, scope and equivalent concept of the embodiments described herein.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A transparent display apparatus comprising:
 a substrate including a display area and a non-display area adjacent to the display area;
 a plurality of pixels disposed in the display area, each pixel having a first transmissive portion and a plurality of subpixels; and
 a plurality of gate-driver-in-panel (GIP) portions disposed in the non-display area, each GIP portion including a second transmissive portion and a plurality of block portions,
 wherein:
  the plurality of subpixels include a first subpixel configured to emit white light,
  the plurality of block portions include a first block portion disposed at a position corresponding to a position of the first subpixel in the pixel, and
  the first block portion includes a dummy pattern configured to be same as or similar to the first subpixel.

2. The transparent display apparatus of claim 1, wherein the first block portion does not include a color filter.

3. The transparent display apparatus of claim 1, wherein the plurality of block portions further include a plurality of second block portions disposed to be adjacent to the first block portion, and
the first block portion is disposed between the second block portions.

4. The transparent display apparatus of claim 3, wherein the first block portion is disposed in a first direction, and
the second block portions are disposed in a second direction crossing the first direction.

5. The transparent display apparatus of claim 4, wherein the plurality of subpixels further include a second subpixel, a third subpixel and a fourth subpixel,
the plurality of second block portions further include a red block portion, a green block portion and a blue block portion,
the red block portion is disposed at a position corresponding to a position of the second subpixel in the pixel,
the green block portion is disposed at a position corresponding to a position of the third subpixel in the pixel, and
the blue block portion is disposed at a position corresponding to a position of the fourth subpixel in the pixel.

6. The transparent display apparatus of claim 1, wherein the dummy pattern includes a plurality of conductive layers that are stacked.

7. The transparent display apparatus of claim 6, wherein the dummy pattern includes:
a first conductive layer disposed over the substrate;
a second conductive layer disposed over the first conductive layer; and
a third conductive layer disposed over the second conductive layer, and
the first conductive layer at least partially overlaps the second conductive layer and the third conductive layer.

8. The transparent display apparatus of claim 7, wherein the first conductive layer is disposed on a same layer as a common voltage line provided on the substrate,
the second conductive layer is disposed on a same layer as a gate electrode provided in the plurality of subpixels, and
the third conductive layer is formed on a same layer as a source or drain electrode provided on the gate electrode.

9. The transparent display apparatus of claim 7, wherein at least one of the first conductive layer, the second conductive layer or the third conductive layer is configured to be a line for supplying a signal or a power source to the display area.

10. The transparent display apparatus of claim 1, wherein the non-display area includes a buffer area disposed to be adjacent to the display area, the buffer area including a plurality of GIP circuits, and
the dummy pattern is electrically connected to a GIP circuit of the plurality of GIP circuits.

11. The transparent display apparatus of claim 10, wherein the dummy pattern is configured to be a capacitor.

12. A transparent display apparatus comprising:
a substrate including a display area and a non-display area near the display area;
a plurality of pixels disposed in the display area, each pixel including a first transmissive portion and a plurality of subpixels; and
a plurality of gate-driver-in-panel (GIP) portions disposed in the non-display area on the substrate, the GIP portions each including a second transmissive portion and a plurality of block portions,
wherein:
the plurality of subpixels include a first subpixel, the first subpixel including at least three pixel conductive layers that overlap one another,
the plurality of block portions include a first block portion disposed at a position corresponding to a position of the first subpixel in the pixel, and
the first block portion includes at least three non-pixel conductive layers disposed on same layers as the at least three pixel conductive layers, respectively, the at least three non-pixel conductive layers overlap one another.

13. The transparent display apparatus of claim 12, wherein the at least three non-pixel conductive layers of the first block portion include:
a first conductive layer disposed on a same layer as a common voltage line provided on the substrate;
a second conductive layer disposed over the first conductive layer and disposed on a same layer as a gate electrode provided in the plurality of subpixels; and
a third conductive layer disposed on the second conductive layer and provided on a same layer as a source or drain electrode disposed over the gate electrode.

14. The transparent display apparatus of claim 12, wherein at least one of the non-pixel conductive layers of the first block portion is configured as a line for supplying a signal or a power source to the display area.

15. The transparent display apparatus of claim 12, wherein the non-display area includes a buffer area disposed to be adjacent to the display area, the buffer area including a plurality of GIP circuits, and
at least one of the non-pixel conductive layers is electrically connected to a GIP circuit of the plurality of GIP circuits.

16. The transparent display apparatus of claim 15, wherein the non-pixel conductive layers are used as capacitors.

17. A transparent display apparatus comprising:
a substrate including a display area and a non-display area adjacent to the display area;
a plurality of pixels disposed in the display area, each pixel including a first transmissive portion and a plurality of subpixels; and
a plurality of gate-driver-in-panel (GIP) portions disposed in the non-display area, each GIP portion including a second transmissive portion and a plurality of block portions,
wherein:
the display area includes a common voltage line;
a subpixel of the plurality of subpixels includes a transistor, a gate electrode and a source or drain electrode of the transistor overlapping the common voltage line; and
the plurality of block portions include a dummy pattern having a first conductive layer, a second conductive layer, and a third conductive layer, the first conductive layer being in a same layer as the common voltage line, the second conductive layer being in a same layer as the gate electrode, the third conductive layer being in a same layer as at least one of the source or drain electrode, and the second and third conductive layers overlapping the first conductive layer.

18. The transparent display apparatus of claim 17, wherein the plurality of block portions include a first block portion and a plurality of second block portions, the dummy pattern is in the first block portion, the first block portion is disposed in a first direction, and the plurality of second block portions are each disposed in a second direction that crosses the first direction.

19. The transparent display apparatus of claim 17, wherein the first, second, and third conductive layers overlap one another.

20. The transparent display apparatus of claim 19, wherein the dummy pattern includes a buffer layer between the first conductive layer and the second conductive layer.

* * * * *